United States Patent [19]

Tsai et al.

[11] Patent Number: 5,668,024
[45] Date of Patent: Sep. 16, 1997

[54] CMOS DEVICE STRUCTURE WITH REDUCED RISK OF SALICIDE BRIDGING AND REDUCED RESISTANCE VIA USE OF A ULTRA SHALLOW, JUNCTION EXTENSION, ION IMPLANTATION PROCESS

[75] Inventors: Chaochieh Tsai, Taichung; Shun-Liang Hsu, Hsin-chu, both of Taiwan

[73] Assignee: Taiwan Semiconductor Manufacturing Company, Hsin-Chu, Taiwan

[21] Appl. No.: 682,490

[22] Filed: Jul. 17, 1996

[51] Int. Cl.$^6$ .................................. H01L 21/8238
[52] U.S. Cl. .................. 438/199; 438/217; 438/231; 438/233; 438/664; 438/683
[58] Field of Search .................. 437/34, 56, 57, 437/58, 59, 200, 41 RCM, 913; 148/DIG. 147

[56] References Cited

U.S. PATENT DOCUMENTS

| | | | |
|---|---|---|---|
| 4,912,061 | 3/1990 | Nasr | 437/44 |
| 5,015,595 | 5/1991 | Wollesen | 437/34 |
| 5,102,816 | 4/1992 | Manukonda et al. | 437/34 |
| 5,234,850 | 8/1993 | Liao | 437/34 |
| 5,362,670 | 11/1994 | Iguchi et al. | 437/56 |
| 5,427,964 | 6/1995 | Kaneshiro et al. | 437/57 |
| 5,439,839 | 8/1995 | Jang | 437/44 |
| 5,512,502 | 4/1996 | Ootsuka et al. | 437/34 |

*Primary Examiner*—Michael Trinh
*Attorney, Agent, or Firm*—George O. Saile

[57] ABSTRACT

A method for forming a CMOS device, with improved yield, performance and reliability characteristics, has been developed. Yield improvements have been addressed by the use of a dual insulator spacer, used to reduce the risk of salicide bridging, as well as the use of pocket implantation regions, used to reduce punchthrough leakage. An ultra shallow junction extension region has been created in a peripheral channel region, reducing the resistance of this region, thus enhancing the performance of the CMOS device. In addition, ultra lightly doped source and drain regions are used to relax reliability concerns, regarding hot electron injection.

34 Claims, 7 Drawing Sheets

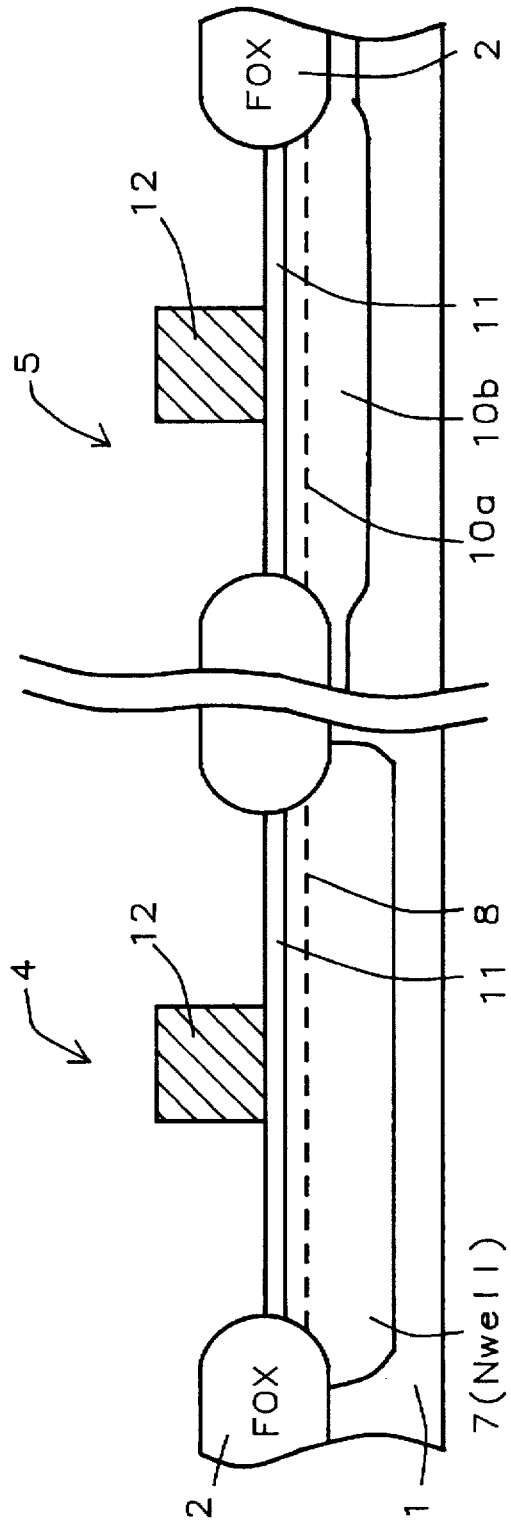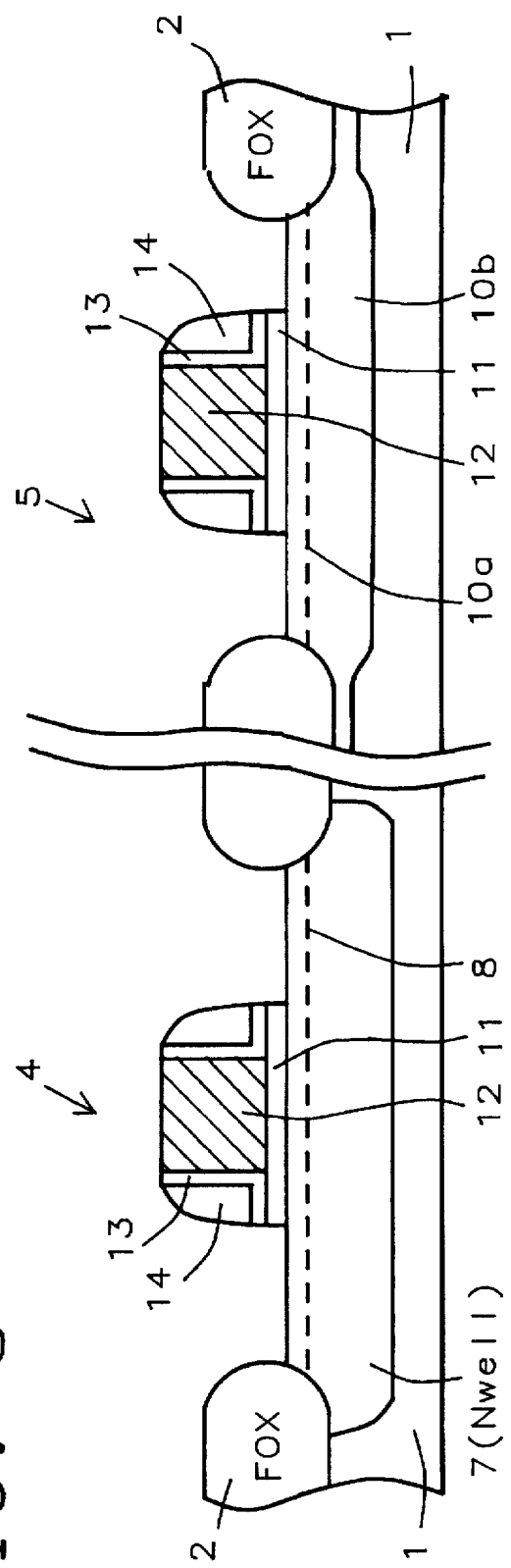

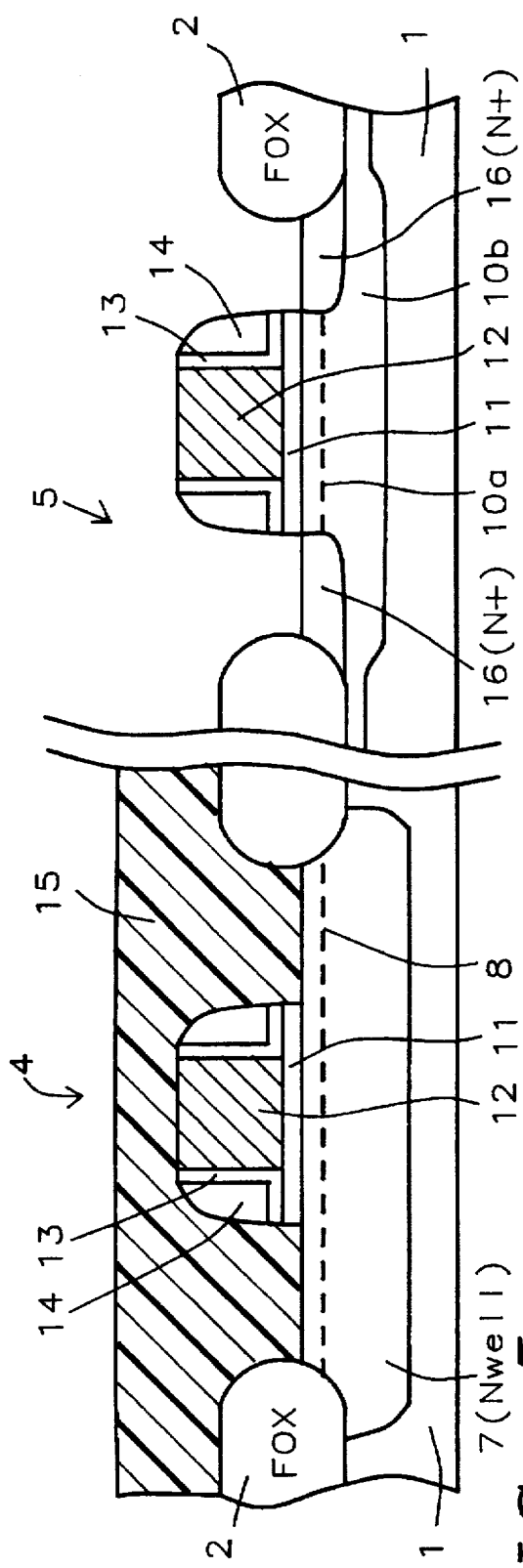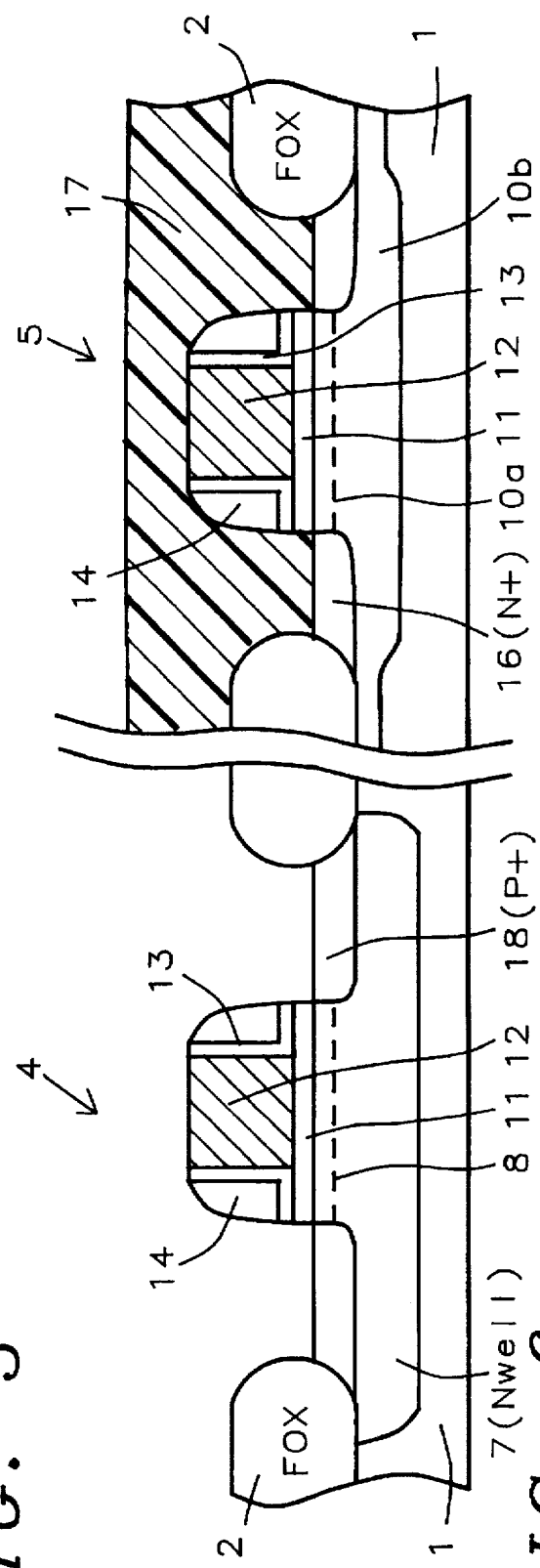

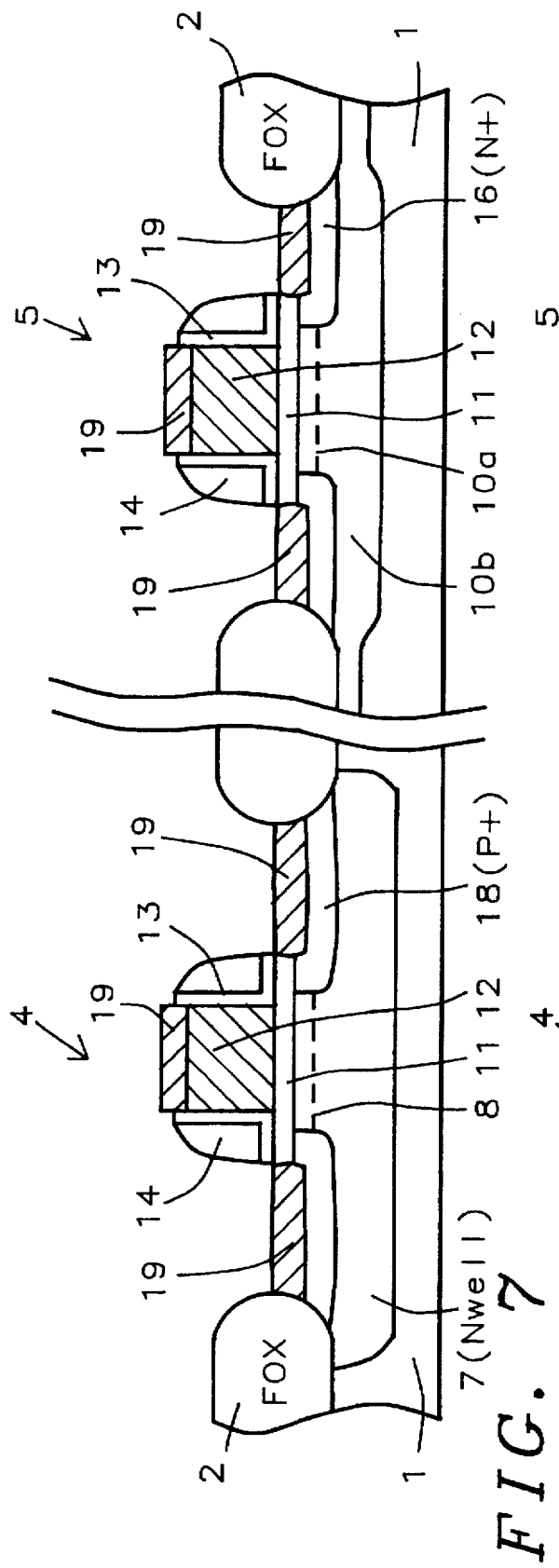
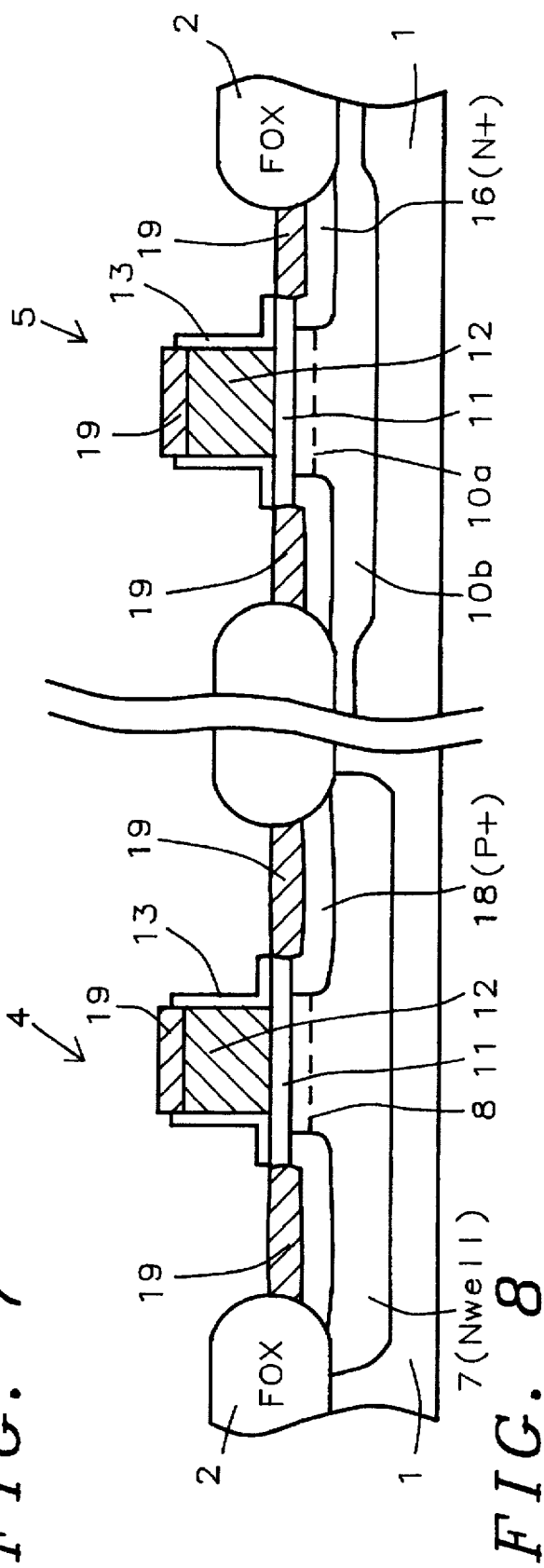

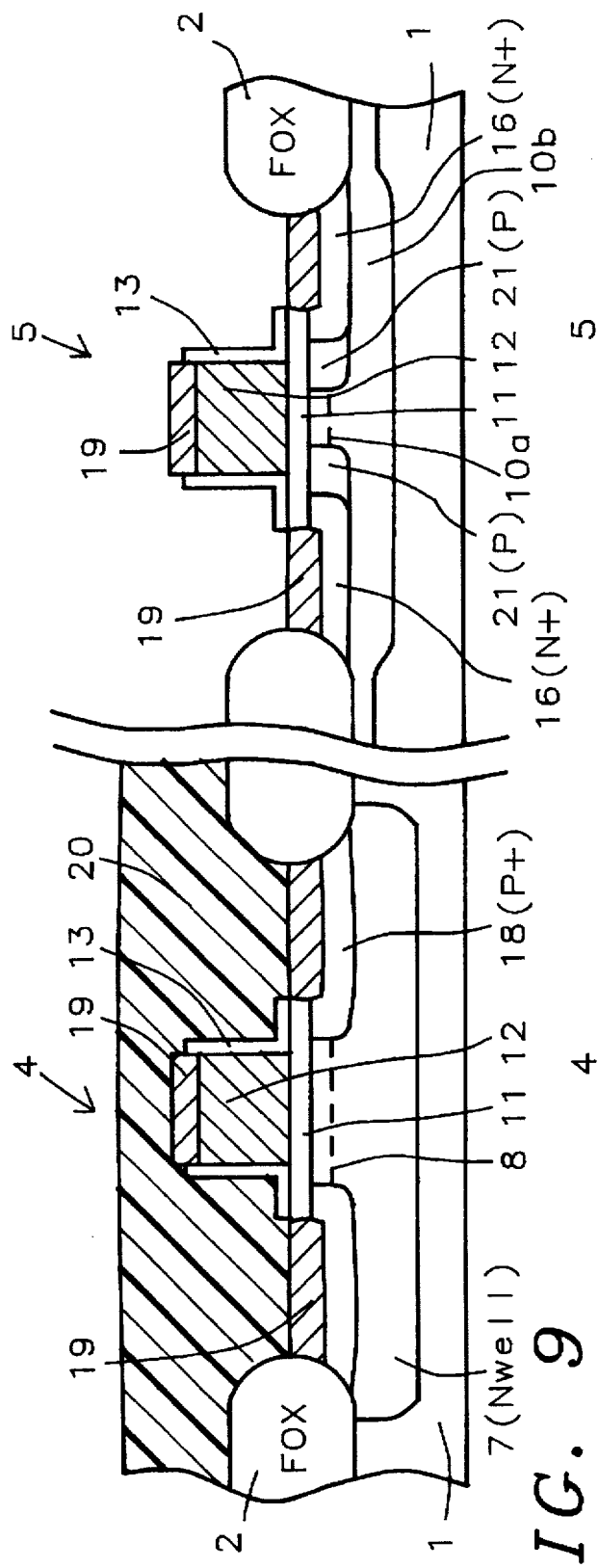
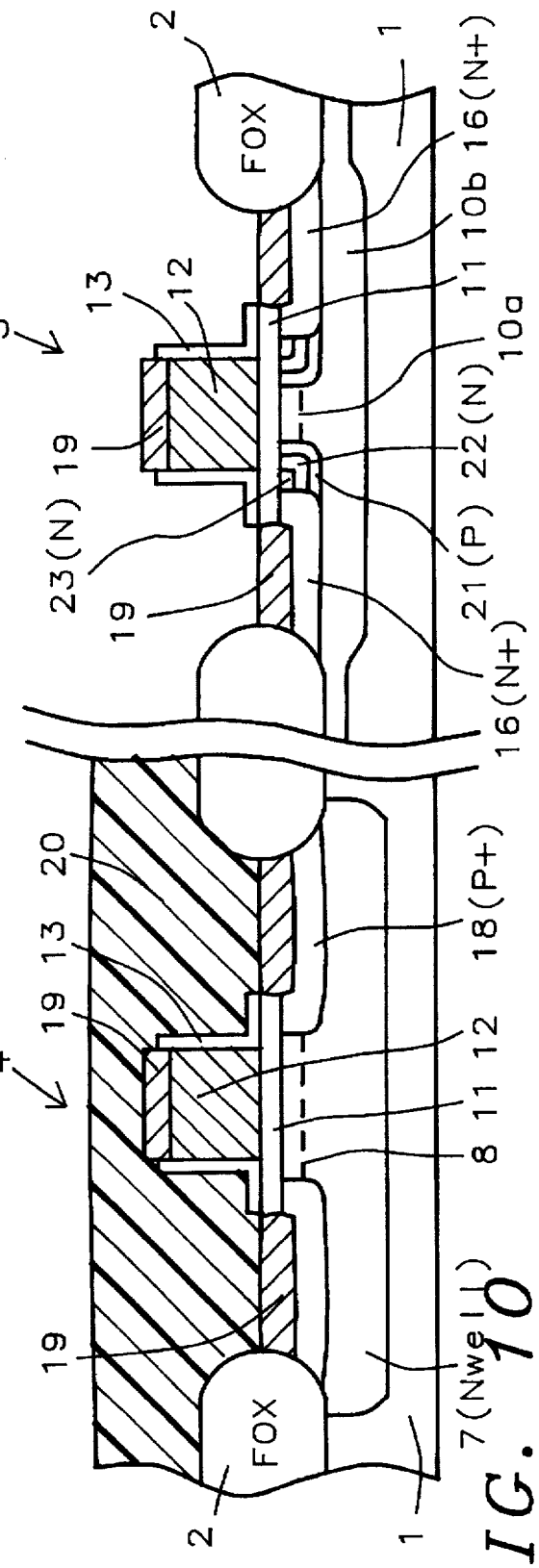
FIG. 9
FIG. 10

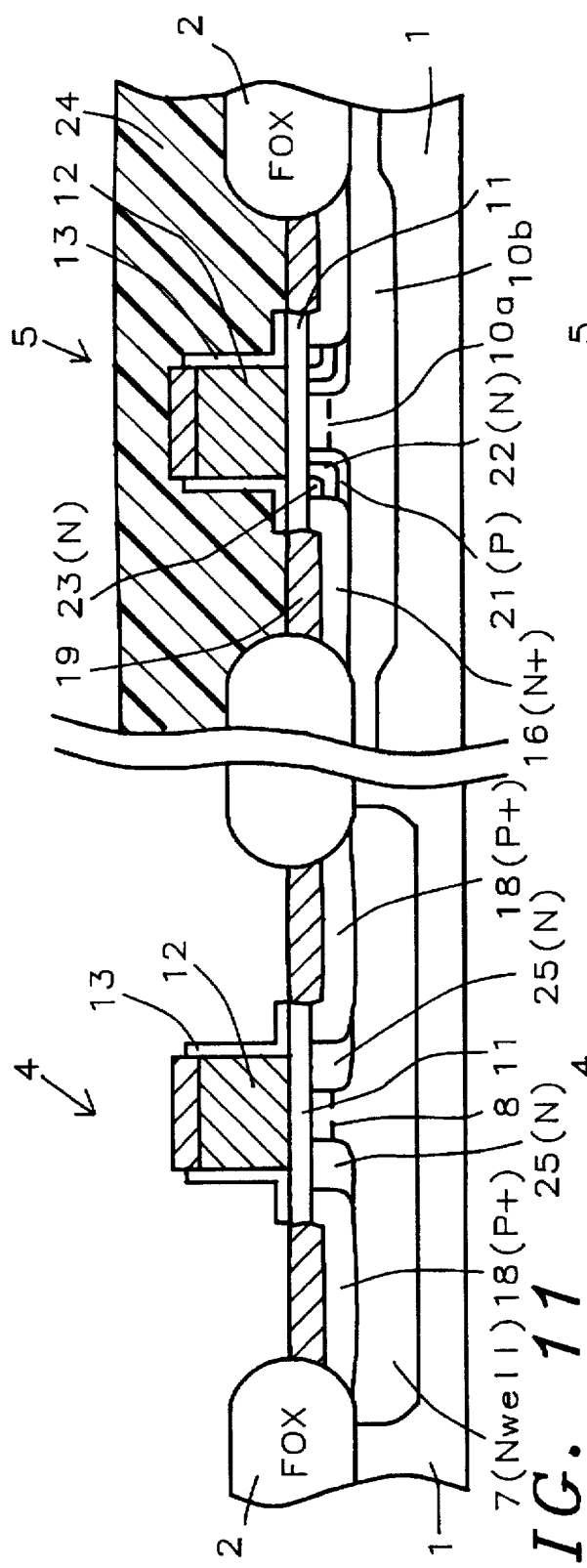
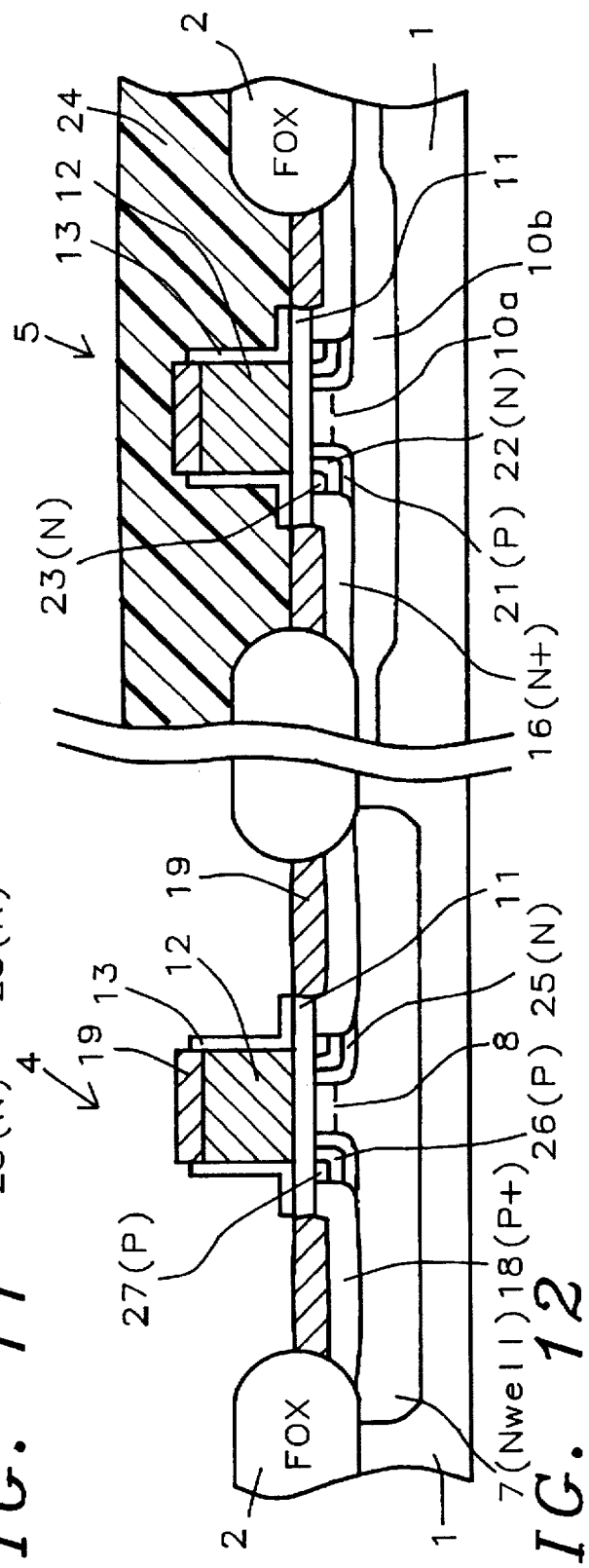
FIG. 11
FIG. 12

CMOS DEVICE STRUCTURE WITH REDUCED RISK OF SALICIDE BRIDGING AND REDUCED RESISTANCE VIA USE OF A ULTRA SHALLOW, JUNCTION EXTENSION, ION IMPLANTATION PROCESS

BACKGROUND OF THE INVENTION (1) Field of the Invention

The present invention relates to a process in which complimentary metal oxide semiconductor, (CMOS), field effect transistors, are fabricated, with specific process steps included to improve CMOS performance while reducing the risk of yield and reliability failures.

(2) Description of Prior Art

Very large scale integration, (VLSI), has allowed the semiconductor chip industry to increase circuit density while still maintaining, or reducing cost. This has been accomplished by ability of the semiconductor industry to fabricate silicon devices with sub-micron features, or micro-miniaturazation. The attainment of sub-micron features has been achieved mainly by advances in specific semiconductor fabrication disciplines, such as photolithography and reactive ion etching, (RIE). The use of more sophisticated exposure cameras, as well as the development of more sensitive photoresist materials, have allowed sub-micron images in photoresist to be routinely obtained. Similar advances in dry etching tools and processes have resulted in the successful transfer of these sub-micron images in photoresist, to underlying materials, used for the fabrication of advanced CMOS devices.

However with the trend to smaller devices, specific yield and performance detractors, as well as reliability risks, become more prevalent. For example as the ate insulator of a CMOS device becomes thinner, in an attempt to improve device performance, the possibility of yield loss, due to insulator breakdown becomes greater. In addition as the channel length of the CMOS device becomes shorter, again to improve performance, the reliability risk of hot electron injection increase. Narrower channel lengths also present yield problems in terms of junction punchthrough. As the channel length of a CMOS device shortens, the space between depletion regions, created from the source region and the substrate, and from the drain region and substrate, decrease. This close proximity, or touching of depletion regions, can result in punchthrough leakages, or yield detractors. In addition salicide, (Self-Aligned silICIDE), bridging, or the inability to completely separate the silicide formed on the source and drain regions, from the salicide formed on the gate structure of a CMOS device, can also result in yield loss.

Several solutions for these phenomena, occurring with narrow channel length CMOS devices, have been previously described. For example Jang, in U.S. Pat. No. 5,439,839, as well as Nasr, in U.S. Pat. No. 4,912,061, have described processes in which salicide bridging is addressed via use of a disposable sidewall spacer. However this invention will describe a CMOS process that will offer yield enhancements, regarding decreased salicide bridging, via use of a disposable sidewall spacer, formed via use of a dual insulator spacer structure. However in this invention the removal of part of the dual insulator spacer exposes a peripheral channel region, in which a pocket ion implantation procedure, used to reduce source and drain punchthrough leakage, is performed. In addition the incorporation of an ultra shallow ion implantation region, used to decrease the resistance between the silicide on the source and drain region, and the channel region, is also included in the peripheral channel region. These process steps enable sub-quarter micron CMOS devices, with enhanced yield and performance to be realized.

SUMMARY OF THE INVENTION

It is an object of this invention to provide a process for manufacturing a sub-quarter micron channel length, CMOS device, that will offer specific process steps used to improve yield, performance and reliability.

It is another object of this invention to use a dual insulator sidewall spacer, with the removal of the overlying insulator layer of the dual sidewall insulator spacer, performed after salicide formation, to reduce the risk of salicide bridging.

It is still another object of this invention to use a pocket ion implantation procedure, performed in a peripheral channel region, between a polysilicon gate structure and a heavily doped source and drain region, to reduce the risk of punchthrough leakage created by the close proximity of the depletion regions, formed from source and drain and substrate regions.

It is yet another object of this invention to perform an ultra shallow, ion implantation, junction extension procedure, in the peripheral channel region, to improve the performance of the sub-quarter micron CMOS device by reducing the resistance of this region.

In accordance with the present invention a method is described for fabricating a CMOS device in which yield, reliability and performance are improved via use specific process steps and sequences, such as the use of a dual insulator sidewall spacer, the use of a pocket ion implantation procedure, and the use of an ultra shallow junction extension procedure. After the formation of field oxide regions, an N well region is formed, via ion implantation procedures, in areas not covered by field oxide, with the N well region used for only the P channel, (PFET), devices of the CMOS device. Ion implantation processing is then performed for purposes of adjusting the threshold voltage of the ensuing PFET devices, followed by a photolithographic and ion implantation procedure, used to adjust the threshold voltage of the ensuing N channel, (NFET), devices. After the formation of a thin gate insulator, a polysilicon layer, is deposited, and patterned to create a polysilicon gate structure via use of photolithographic and reactive ion etching procedures. A dual insulator layer is next deposited consisting of an underlying layer of plasma enhanced chemical vapor deposited, (PECVD), silicon oxide, and an overlying layer of chemically vapor deposited titanium nitride. Anisotropic reactive ion etching results in the creation of the dual insulator spacer, on the sidewalls of the polysilicon gate structure. Photoresist masking is next performed to allow for the creation of the heavily doped source and drain regions for the NFET devices, via ion implantation procedures, followed by another photoresist blockout procedure, and ion implantation procedure, used to allow for the creation of heavily doped source and drain regions for the subsequent PFET devices. After photoresist removal a rapid thermal anneal, (RTA), procedure is employed to activate the heavily doped source and drain regions. A layer of titanium is next deposited, followed by a rapid thermal anneal, (RTA), procedure, used to form titanium silicide, only on the exposed silicon regions of the CMOS device. The salicide, (Self-ALigned silICIDE), is than established by selective removal of the unreacted titanium from the sides of the dual insulator spacer, using wet chemical etching, followed by the selective removal of the titanium nitride layer, again using wet chemical etching, exposing a peripheral channel region between the polysilicon gate structure and the heavily doped source and drain regions. Photoresist masking is next used to allow processing to occur in the peripheral channel region of NFET devices. First a pocket ion implantation step is performed, to increase the P type doping level of the peripheral channel region, the region between the polysilicon gate structure and the titanium silicide on the heavily doped source and drain regions, thus reducing the effect of subsequent source and drain punchthrough. The same photoresist mask is used to allow the NFET, ultra lightly doped source and drain, (ULDD), region to be formed via another ion implantation step, resulting in lower parasitic junction capacitance of source and drain regions. Finally a ultra shallow, junction extension ion implantation step is performed, in the peripheral channel region, creating a more conductive N type region between the polysilicon gate structure and the titanium silicide, on the NFET, heavily doped source and drain regions. After photoresist removal, another photoresist masking procedure is performed to allow ion implantation processing to be performed in the peripheral channel regions in PFET regions of the CMOS device. Again a pocket ion implantation step, N type, followed by a lightly doped, P type, LDD ion implantation step, and a P type, ultra shallow, ion implantation step, are performed. After photoresist removal another RTA procedure is performed to enhance the conductivity of the titanium silicide, as well as activating the junction extension ion implantation region.

BRIEF DESCRIPTION OF THE DRAWINGS

The object and other advantages of this invention are best described in the preferred embodiment with reference to the attached drawings that include;

FIGS. 1-13, which schematically show the stages of fabrication used to create a CMOS device with a dual insulator spacer, to reduce salicide bridging, an ultra shallow junction extension ion implantation region, to reduce device resistance, and a pocket ion implantation region, to reduce the effect of junction punchthrough.

DESCRIPTION OF THE PREFERRED EMBODIMENTS

Figure 1:
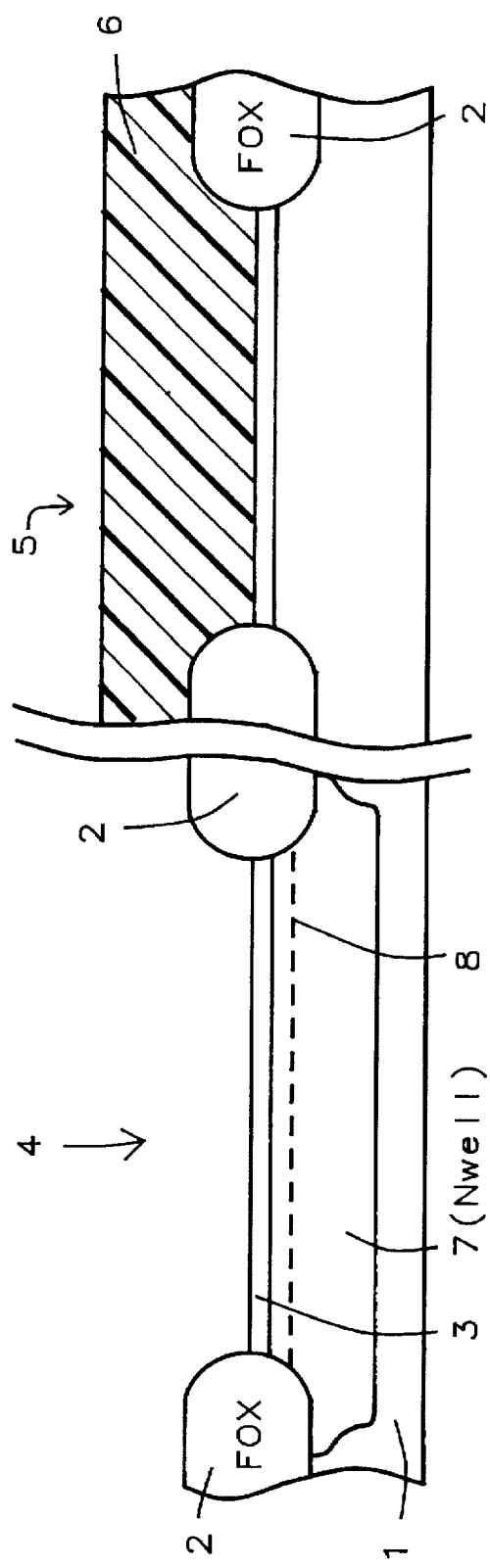

The method of creating a CMOS device, with a sub-quarter micron channel length, using a dual insulator spacer, a pocket ion implantation region, an ultra lightly doped source and drain region, and a ultra shallow, junction extension, ion implantation region, will now be covered in detail. Referring to FIG. 1, a substrate, 1, composed of P type, single crystalline silicon, with a <100> orientation, is used. Field oxide, (FOX), region, 2, is formed for isolation purposes, separating the subsequent P channel region, (PFET), 4, from the subsequent N channel region, (NFET), 5. The FOX region is formed by initially growing a thin layer of silicon dioxide, 3, via thermal oxidation processing, and than depositing a layer of silicon nitride, (not shown in FIG. 1). The silicon nitride is deposited via either low pressure chemical vapor deposition, (LPCVD), or plasma enhanced chemical vapor deposition, (PECVD), processing. Photolithographic and reactive ion etching, (RIE) processing, are used to create a desired pattern in the oxidation resistant, silicon nitride—silicon dioxide layer. After photoresist removal, via plasma oxygen ashing and careful wet cleans, FOX region, 2, is thermally grown in an oxygen—steam ambient, to create a FOX region, 2, to a thickness between about 3000 to 5000 Angstroms in regions not protected by the silicon nitride—silicon dioxide, oxidation resistant pattern. The silicon nitride layer is than removed in a hot phosphoric acid solution. Another photoresist pattern, 6, is used to blockout NFET region, 5, from an ion implantation of phosphorous, at an energy between about 300 to 800 KeV, at a dose between about 5E12 to 1E13 atoms/c², used to create N well region, 7, shown schematically for the PFET region, 4, in FIG. 1. Photoresist pattern, 6, is again used to blockout NFET region, 5, and allow an ion implantation of phosphorous or arsenic, to be performed at an energy between about 25 to 80 KeV, at a dose between about 2E12 to 4E12 atoms/c², to create threshold adjust region, 8, for PFET region, 4. Photoresist pattern, 6, is than removed via plasma oxygen ashing and careful wet cleans.

Figure 2:
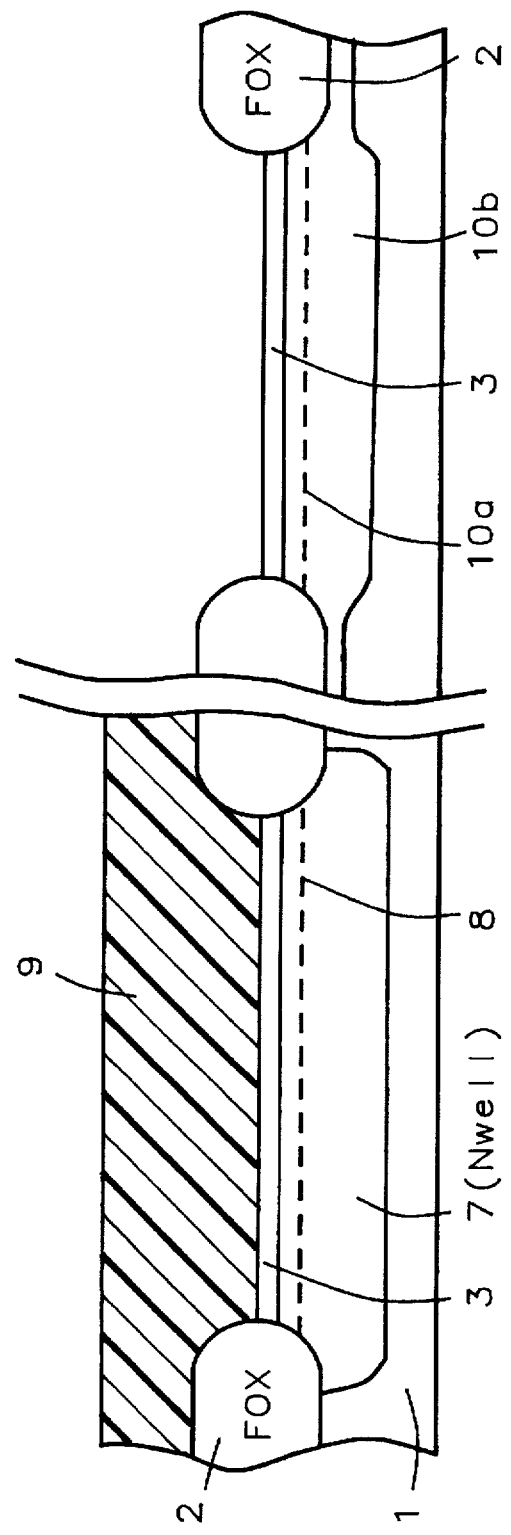

Another photoresist pattern, 9, is used to blockout the PFET regions, 4, from an ion implantation procedure of $BF_2$, at an energy between about 20 to 40 KeV, at a dose between about 2.5E12 to 4E12 atoms/cm², used to create a threshold voltage adjust region, 10a, shown schematically in FIG. 2. Also shown schematically in FIG. 2, is a P well region, 10b, and channel stop region, 10b, under FOX region, 2, created via ion implantation of boron, at an energy between about 130 to 180 KeV, at a dose between about 5E12 to 7E12 atoms/cm². Photoresist removal is accomplished via plasma oxygen ashing and careful wet cleans. Silicon dioxide layer, 3, is next removed using a dilute hydrofluoric, (HF), acid solution, consisting of 50 parts $H_2O$, to one part HF. After careful wet cleans, a silicon dioxide, gate insulator, 11, is thermally grown, in an oxygen—steam ambient, at a temperature between about 800° to 1000° C., to a thickness between about 30 to 300 Angstroms. Next the deposition of a polysilicon layer, is performed using LPCVD processing, at a temperature between about 500° to 650° C., to a thickness between about 2000 to 4000 Angstroms. The polysilicon layer, can be grown using insitu doping procedures, via incorporation of arsine or phosphine, to a silane ambient. The polysilicon layer, can also be deposited intrinsically, and doped via ion implantation of arsenic or phosphorous, at an energy between about 30 to 75 KeV, at a dose between about 5E14 to 1E16 atoms/cm². Photolithographic and RIE processing, using $SF_6$ or $Cl_2$ as an etchant, are used to create polysilicon gate structure, 12, shown schematically in FIG. 3. Polysilicon gate structure, 12, is between about 1000 to 3500 Angstroms in width. Photoresist removal is performed using plasma oxygen ashing, followed by careful wet cleans.

FIG. 4, shows the creation of a dual insulator spacer, created by initially depositing a layer of silicon oxide, 13, via PECVD procedure, at a temperature between about 350° to 450° C., to a thickness between about 100 to 400 Angstroms, using tetraethylorthosilicate, (TEOS), as a source. Next a layer of titanium nitride, (TiN), 14, is deposited via chemical vapor deposition procedures, at a temperature between about 540° to 660° C., to a thickness between about 1000 to 3000 Angstroms. The thickness of the titanium nitride layer will determine the width of a subsequently formed, peripheral channel region. Two consecutive anisotropic, selective RIE procedures, the first using HCL—$Cl_2$, and the second using $CHF_3$ as etchants, are next employed to form the sidewall spacer, shown schematically in FIG. 4. The spacer definition also selectively removes gate insulator, 11, from areas exposed to the RIE procedure, between FOX regions, 2, and polysilicon gate structure, 12.

The creation of heavily doped source and drain regions for both PFET regions, 4, and NFET regions, 5, are next performed and shown schematically in FIGS. 5-6. First a photoresist pattern, 15, is used to block the PFET region, 4, from an arsenic ion implantation procedure, performed at an energy between about 40 to 80 KeV, at a dose between about 3E15 to 5E15 atoms/cm$^2$, creating the heavily doped N type source and drain region, 16, shown in FIG. 5. After removal of photoresist pattern, 15, via plasma oxygen ashing and careful wet cleans, another photoresist pattern, 17, is used to block NFET region, 5, from a BF ion implantation procedure, performed at an energy between about 35 to 60 KeV, at a dose between about 2E15 to 4E15 atoms/cm$^2$, used to create the heavily doped P type source and drain regions, 18, shown schematically in FIG. 6. After removal of photoresist pattern, 17, via plasma oxygen ashing and careful wet cleans, a first rapid thermal anneal, (RTA), procedure is performed at a temperature between about 950° to 1050° C., for a time between about 10 to 30 sec. in a nitrogen ambient, for purposes of activating the heavily doped source and drain implant regions.

The formation of Self-ALigned silICIDE, (salicide), contacts to the heavily doped source and drain regions, as well as to the polysilicon gate structure, is next addressed. After a preclean in a hydrofluoric acid solution, a layer of titanium is deposited using r.f sputtering procedures, to a thickness between about 300 to 450 Angstroms. A second RTA procedure is performed at a temperature between about 650° to 750° C., for a time between about 10 to 30 sec., in a nitrogen ambient, to form titanium silicide, 19, in regions in which titanium overlaid silicon, such as the heavily doped source and drain areas, as well as the top surface of the polysilicon gate structure. The unreacted titanium, overlying the FOX regions, 2, or on the top layer of the dual insulator spacer, titanium nitride, 14, as well as the top layer of the dual insulator spacer, TiN, 14, are simultaneously removed using a 1:1:1 solution of $NH_4OH$—$H_2O_2$—$H_2O$, at a temperature of about 25° C., for a time of about 30 min., leaving titanium silicide, 19, on the heavily doped source and drain regions and on the top surface of the polysilicon gate structure. This is shown schematically in FIG. 7. However in some cases the formation of titanium silicide results in thin ribbons of titanium silicide on the top surface of the dual insulator spacer, bridging the polysilicon gate structure and the heavily doped source and drain regions, resulting in either unwanted leakage or shorts. The bridging phenomena is more prevalent with the narrower channel lengths, due to narrower insulator spacers, and thinner polysilicon gate structures. Therefore to achieve successful sub-quarter micron devices, potential titanium silicide bridging has to be addressed. In this invention the risk of bridging is eliminated via the removal of the top layer of the dual insulator spacer, titanium nitride, 14, during the unreacted titanium removal procedure. The removal of titanium nitride layer, 14, overlying silicon oxide layer, 13, insures the removal of any titanium silicide ribbons, that may have resided on the titanium nitride layer, 14, after the second RTA procedure. The removal of the titanium nitride layer also creates a peripheral channel region, between polysilicon gate structures and heavily doped source and drain regions. This is schematically shown in FIG. 8.

The region between the heavily doped source and drain regions, and the polysilicon gate structure, the peripheral channel region, can now be engineered to provide additional CMOS device yield enhancements, as well as also providing CMOS device performance and reliability enhancements. Another photoresist pattern, 20, is used to block PFET region, 4, from a ion implantation procedure, using boron, at an energy between about 20 to 80 KeV, at a dose between about 5E13 to 1E14 atoms/cm$^2$, to create a P type, pocket ion implanted region, 21, for the NFET region, 5, shown schematically in FIG. 9. This region offers a higher P type concentration than exists in substrate, 1, or P well region, 10b, therefore restricting the extent of a depletion region, formed from the N type, heavily doped source and drain regions and the P type substrate, 1, or P well region, 10b. The smaller depletion region reduces the risk of punchthrough, and the level of punchthrough leakage, due to the converging depletion regions, in the narrow channel region of a sub-quarter micron device, thus offering improving yield for the CMOS device.

Again using photoresist pattern, 20, to blockout PFET region, 4, an N type, ultra lightly doped source and drain region, 22, (ULDD),is formed via ion implantation of phosphorous, at an energy between about between about 20 to 30 KeV, at a dose between about 3E11 to 2E12 atoms/cm$^2$. This ULDD region reduces the field in the narrow channel region, thus reducing the risk of hot electron carrier injection. This reliability enhancement is schematically shown in FIG. 10. Furthermore the ULDD region also reduces the junction capacitance of the pocket implant region, 21, due to the increase of the depletion width inside the source and drain region. The performance of the sub-quarter micron device is next addressed with yet another ion implantation procedure, in the NFET region, 5, again using photoresist pattern, 20, to protect the PFET region, 4. An N type, ultra shallow, junction extension, 23, is formed via the ion implantation of arsenic, at an energy between about 10 to 25 KeV, at a dose between about 5E14 to 3E15 atoms/cm$^2$. The ultra shallow, junction extension, more conductive than ULDD region, 22, lowers the resistance of the NFET device, resulting in performance enhancements. The ultra shallow, junction extension, 23, is schematically shown in FIG. 10. Photoresist pattern, 20, is now removed using plasma oxygen ashing and careful wet cleans.

Similar processing, used to enhance yield, reliability, and performance for the NFET region, 5, is now performed to the PFET region, 4. Another photoresist pattern, 24, is used to blockout the NFET regions, 5, from an ion implantation of phosphorous, at an energy between about 100 to 160 KeV, at a dose between about 5E13 to 1E14 atoms/cm$^2$. The N type, pocket ion implanted region, 25, shown schematically in FIG. 11, offers a higher N type concentration than the N level concentration in N well region, 7, thus reducing the risk of punchthrough between the converging depletion regions formed from P type source and drain region, 18, and N well region, 7. Photoresist pattern, 24, is than used to protect the NFET region, 5, from a BF$_2$ ion implantation procedure, performed at an energy between about 20 to 50 KeV, at a dose between about 5E11 to 2E12 atoms/cm$^2$. This procedure creates the P type, ultra lightly doped source and drain region, 26, used to reduce hot electron carrier injection in the narrow channel of the PFET device. This is shown schematically in FIG. 12. Finally a P type, ultra shallow, junction extension, 27, used to lower the PFET resistance, is created in the PFET region via an ion implantation of BF, at an energy between about 10 to 20 KeV, at a dose between about 5E14 to 3E15 atoms/cm$^2$, schematically shown in FIG. 12. Photoresist pattern, 24, is removed via use of plasma oxygen ashing and careful wet cleans. A third RTA procedure is performed at a temperature between about 800° to 1000° C., for a time between about 5 to 10 sec., to activate the dopants in the ultra shallow junction extension regions.

Figure 13:
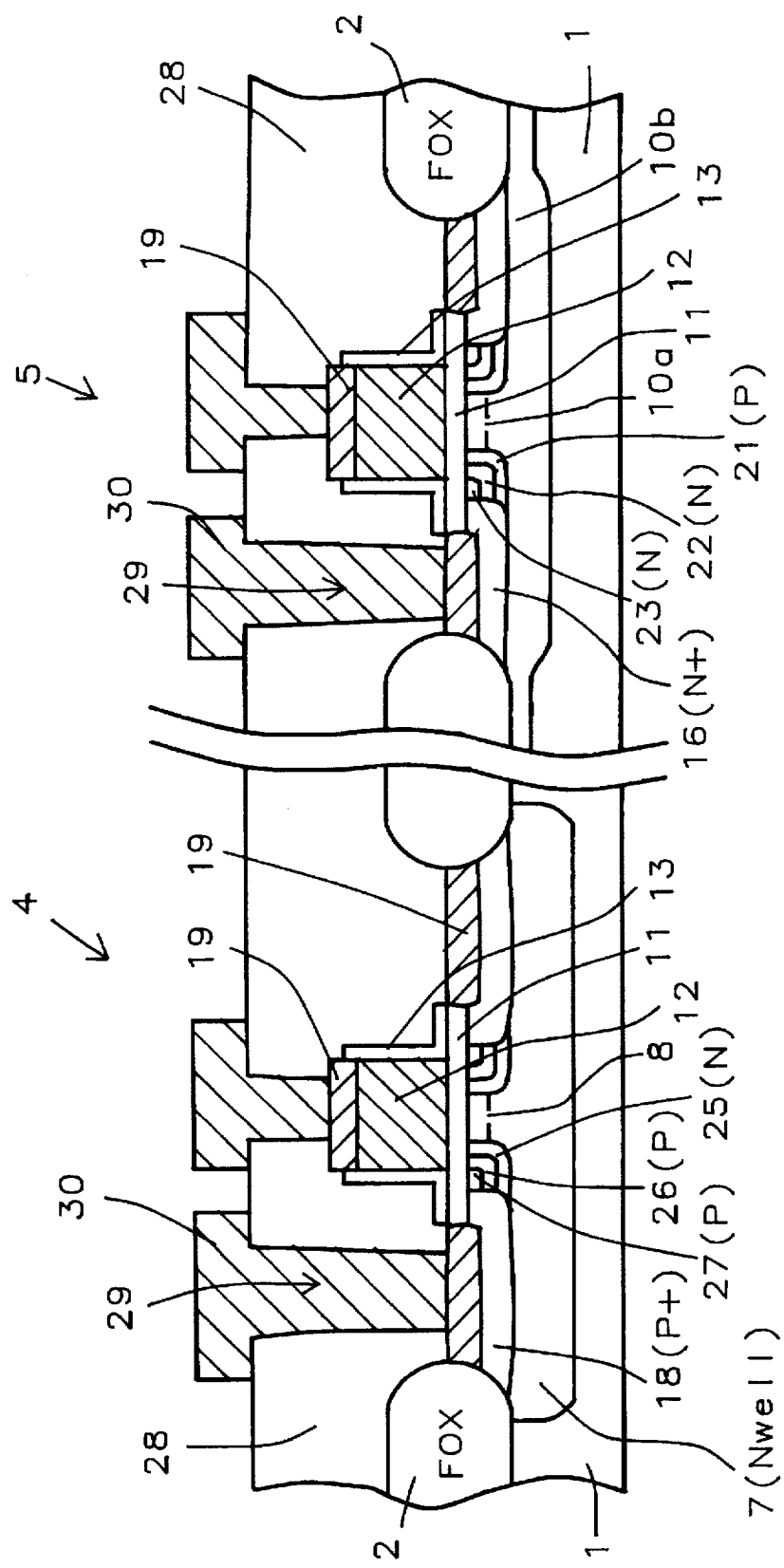

A layer of silicon oxide, 28, is next deposited using LPCVD or PECVD processing, at a temperature between about 400° to 800° C., to a thickness between about 5000 to 15000 Angstroms. Silicon oxide layer 28, is planarized using chemical mechanical polishing procedures. Conventional photolithographic and RIE procedures, using $CHF_3$ as an etchant, are used to create contact hole, 29, shown schematically in FIG. 13. After photoresist removal, via plasma oxygen ashing, followed by careful wet cleans, a layer of titanium, and a layer of titanium nitride, between about 500 to 1500 Angstroms, and between 1000 to 2000 Angstroms, respectfully, are deposited via r.f. sputtering procedures, and followed by a layer of aluminum, containing between about 1 to 3% copper, and between about 0 to 2% silicon, again deposited using r.f. sputtering, to a thickness between about 3000 to 8000 Angstroms. Conventional photolithographic and RIE procedures, using a $Cl_2$ etchant, are used to create metallization structure, 30, consisting of aluminum—titanium nitride—titanium, and shown schematically in FIG. 13. Plasma oxygen ashing, followed by careful wet cleans, are again used to remove photoresist.

This process, used to create CMOS devices, benefitting in terms of yield, performance and reliability, as a result of the dual insulator spacer, the pocket ion implantation region, and the ultra shallow junction extension, although shown for complimentary, (CMOS), devices, can be applied to MOSFET, (metal oxide semiconductor field effect transistors), comprised of only either NFET or PFET devices. This invention can also be applied to BiCMOS, (bipolar—CMOS) devices, as well.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a CMOS device, on a semiconductor substrate, comprising the steps of:

forming field oxide regions in said semiconductor substrate;

ion implanting a first conductivity imparting dopant into an area of said semiconductor substrate, to form an N well region, in an area of said semiconductor substrate that is used for a PFET region, of said CMOS device;

ion implanting a second conductivity imparting dopant into said PFET region, to adjust the threshold voltage of devices fabricated in said PFET region;

ion implanting a third conductivity imparting dopant into an area of said semiconductor substrate that is used for an NFET region, of said CMOS device, to form a channel stop and a P well region;

ion implanting a fourth conductivity imparting dopant into an area of said semiconductor substrate that is used for said NFET region of said CMOS device, to adjust the threshold voltage of devices fabricated in said NFET region;

growing a gate insulator layer on said semiconductor substrate;

depositing a polysilicon layer on said gate insulator layer and on said field oxide regions;

anisotropic etching of said polysilicon layer to form polysilicon gate structures on said gate insulator layer;

depositing a first sidewall insulator layer on said polysilicon gate structures, and on said gate insulator layer and field oxide regions, not covered by said polysilicon gate structures;

depositing a second sidewall insulator layer on said first sidewall insulator layer, forming a dual sidewall insulator layer;

anisotropic etching of said dual sidewall insulator layer to form a dual insulator spacer on sides of said polysilicon gate structures;

ion implanting a fifth conductivity imparting dopant into said NFET region, of said CMOS device, not covered by said polysilicon gate structure, and not covered by said dual insulator spacer to form N type, heavily doped source and drain regions;

ion implanting a sixth conductivity imparting dopant into said PFET region, of said CMOS device, not covered by said polysilicon gate structure, and not covered by said dual insulator spacer, to form P type, heavily doped source and drain regions;

first rapid thermal annealing to activate the dopants in said N type, heavily doped source and drain regions, and in said P type, heavily doped source and drain regions;

precleaning said NFET region, and said PFET region, using a dilute hydrofluoric acid solution;

depositing a metal layer thereon after said precleaning;

second rapid thermal annealing to convert said metal layer to a metal silicide layer, on the top surface of said polysilicon gate structures, on the top surface of said N type, heavily doped source and drain regions, and on the top surface of said P type, heavily doped source and drain regions, while leaving unreacted metal on the top surface of said dual insulator layer, and on the top surface of said field oxide region;

removing said unreacted metal from the top surface of said dual insulator layer, and from the top surface of said field oxide region;

removing of said second sidewall insulator layer, from said dual insulator layer, exposing a peripheral channel region, covered with said first insulator sidewall layer, with said peripheral channel region located between said polysilicon gate structures and said metal silicide, on said N type, heavily doped source and drain regions, for said NFET region, and located between said polysilicon gate structures and metal silicide, on said P type, heavily doped source and drain regions, for said PFET regions;

ion implanting a seventh conductivity imparting dopant into said peripheral channel region, in said NFET region, to create a P type, pocket ion implanted region;

ion implanting an eight conductivity imparting dopant into said peripheral channel region, in said NFET region, to create an N type, ultra lightly doped source and drain region;

ion implanting a ninth conductivity imparting dopant into said peripheral channel region, in said NFET region, to create an N type, ultra shallow junction extension;

ion implanting a tenth conductivity imparting dopant into said peripheral channel region, in said PFET region, to create a N type, pocket ion implanted region;

ion implanting an eleventh conductivity imparting dopant into said peripheral channel region, in said PFET region, to create a P type, ultra lightly doped source and drain region;

ion implanting a twelfth conductivity imparting dopant into said peripheral channel region, in said PFET region, to create a P type, ultra shallow junction extension;

third rapid thermal annealing, to activate the dopants in said P type, ultra shallow junction extension regions, and in said N type, ultra shallow junction extension regions;

depositing an interlevel insulator layer thereon after third annealing;

opening contact holes in said interlevel insulator layer to metal silicide layers on said N type, heavily doped source and drain regions, to said metal silicide layers on said P type, heavily doped source and drain regions, and to said metal silicide layers on said polysilicon gate structures;

depositing a interconnect metallization layer after forming said contact; and patterning of said interconnect metallization layer to form metal contact structures to said N type, heavily doped source and drain regions, to said P type, heavily doped source and drain regions, and to said polysilicon gate structures.

2. The method of claim 1, wherein said first conductivity imparting dopant, used to create said N well region, in said PFET region, is phosphorous, ion implanted at an energy between about 300 to 800 KeV, at a dose between about 5E12 to 1E13 atoms/cm$^2$.

3. The method of claim 1, wherein said gate insulator layer is silicon dioxide, thermally grown in an oxygen—steam ambient, at a temperature between about 800° to 1000° C., to a thickness between about 30 to 300 Angstroms.

4. The method of claim 1, wherein said polysilicon layer is deposited using LPCVD procedures, at a temperature between about 500° to 650° C., to a thickness between about 2000 to 4000 Angstroms.

5. The method of claim 1, wherein said polysilicon gate structure is created via anisotropic, RIE of said polysilicon layer, using $Cl_2$ or $SF_6$ as an etchant, and resulting in said polysilicon gate structure with a width between about 1000 to 3500 Angstroms.

6. The method of claim 1, wherein said first sidewall insulator layer is silicon oxide, deposited using PECVD procedures, at a temperature between about 300° to 450° C., to a thickness between about 100 to 400 Angstroms.

7. The method of claim 1, wherein said second sidewall insulator layer is titanium nitride, deposited using chemical vapor deposition procedures, at a temperature between about 540° to 660° C., to a thickness between about 1000 to 3000 Angstroms.

8. The method of claim 1, wherein said metal layer is titanium, deposited using r.f. sputtering procedures, to a thickness between about 300 to 450 Angstroms.

9. The method of claim 1, wherein said second rapid thermal annealing, used to form said metal silicide layer, is performed at a temperature between about 650° to 750° C., for a time between about 10 to 30 sec., in a nitrogen ambient.

10. The method of claim 1, wherein unreacted said metal layer is removed using a 1:1:1 solution of $NH_4OH$—$H_2O$—$H_2O_2$, at a temperature between about 23° to 27° C.

11. The method of claim 1, wherein said second sidewall insulator layer is removed using a 1:1:1 solution of $NH_4OH$—$H_2O_2$—$H_2O$, at a temperature between about 23° to 27° C., exposing said peripheral channel region.

12. The method of claim 1, wherein said seventh conductivity imparting dopant, ion implanted into said peripheral channel region, in said NFET region, to create said P type pocket ion implanted region, is boron, ion implanted at an energy between about 20 to 80 KeV, at a dose between about 5E13 to 1E14 atoms/cm$^2$.

13. The method of claim 1, wherein said eight conductivity imparting dopant, ion implanted into said peripheral channel region, in said NFET region, to create said N type, ultra lightly doped source and drain region, is phosphorous, ion implanted at an energy between about to 30 KeV, at a dose between about 3E11 to 2E12 atoms/cm$^2$.

14. The method of claim 1, wherein said ninth conductivity imparting dopant, ion implanted into said peripheral channel region, in said NFET region, to create said N type, ultra shallow junction extension, is arsenic, ion implanted at an energy between about 10 to 25 KeV, at a dose between about 5E14 to 3E15 atoms/cm$^2$.

15. The method of claim 1, wherein said tenth conductivity imparting dopant, ion implanted into said peripheral channel region, in said PFET region, to create said P type pocket ion implanted region, is phosphorous, ion implanted at an energy between about 100 to 160 KeV, at a dose between about 5E13 to 1E14 atoms/cm$^2$.

16. The method of claim 1, wherein said eleventh conductivity imparting dopant, ion implanted into said peripheral channel region, in said PFET region, to create said P type, ultra lightly doped source and drain, is $BF_2$, ion implanted at an energy between about 20 to 50 KeV, at a dose between about 5E11 to 2E12 atoms/cm$^2$.

17. The method of claim 1, wherein said twelfth conductivity imparting dopant, ion implanted into said peripheral channel region, in said PFET region, to create said P type, ultra shallow junction extension, is $BF_2$, ion implanted at an energy between about 10 to 20 KeV, at a dose between about 5E14 to 3E15 atoms/cm$^2$.

18. A method for fabricating a CMOS device, on a semiconductor substrate, incorporating a pocket ion implanted region and a ultra shallow junction extension, in a peripheral channel region, created via use of a dual insulator spacer, comprising the steps of:

forming field oxide regions in said semiconductor substrate;

ion implanting a first conductivity imparting dopant into said semiconductor substrate, to form an N well region in an area of said semiconductor substrate used for a PFET region of said CMOS device;

ion implanting a second conductivity imparting dopant into said PFET region, to adjust the threshold voltage of devices fabricated in said PFET region;

ion implanting a third conductivity imparting dopant into an area of said semiconductor substrate that is used for an NFET region of said CMOS device, to form a channel stop region and a P well region;

ion implanting a fourth conductivity imparting dopant into said semiconductor substrate, in an region of said semiconductor substrate to be used said NFET region of said CMOS device, to adjust the threshold voltage of devices fabricated in said NFET region;

growing a gate insulator layer on said semiconductor substrate;

depositing a polysilicon layer on said gate insulator layer, and on said field oxide regions;

anisotropic etching of said polysilicon layer to form narrow polysilicon gate structures on said gate insulator layer;

depositing a first silicon oxide layer on said narrow polysilicon gate structures, and on said gate insulator layer, and on said field oxide regions, not covered by said narrow polysilicon gate structures;

depositing a titanium nitride layer on said first silicon oxide layer, forming a dual sidewall insulator layer of an overlying said titanium nitride layer and an underlying said first silicon oxide layer;

anisotropic etching of said dual sidewall insulator layer to form said dual insulator spacer, on the sides of said narrow polysilicon gate structure;

ion implanting a fifth conductivity imparting dopant into said NFET region of said CMOS device, not covered by said narrow polysilicon gate structure, and not covered by said dual insulator spacer, to form N type, heavily doped source and drain regions;

ion implanting a sixth conductivity imparting dopant into PFET region of said CMOS device, not covered by said narrow polysilicon gate structure, and not covered by said dual insulator spacer, to form P type, heavily doped source and drain regions;

first rapid thermal annealing to activate dopants in said N type, heavily doped source and drain regions, and to activate dopants in said P type, heavily doped source and drain regions;

precleaning said NFET region and said PFET region using a dilute hydrofluoric acid solution;

depositing a titanium layer thereon after said precleaning;

second rapid thermal annealing to convert said titanium layer to a titanium silicide layer on the top surface of said narrow polysilicon gate structure, on top surface of said N type, heavily doped regions, and on top surface of said P type, heavily doped regions, while leaving unreacted titanium on the top surface of said titanium nitride layer, and on the top surface of said field oxide regions;

removing of said unreacted titanium from the top surface of said titanium nitride layer, and from the top surface of said field oxide regions;

removing of said titanium nitride layer from said dual insulator spacer, exposing said peripheral channel region, covered with said first silicon oxide layer, with said peripheral channel region located between said narrow polysilicon gate structure and said titanium silicide layers, on said N type, heavily doped source and drain regions, in said NFET region of said CMOS device, and located between said narrow polysilicon gate structure and said titanium silicide layers, on said P type, heavily doped source and drain regions, in said PFET region of said CMOS device;

ion implanting a seventh conductivity imparting dopant into said peripheral channel region, in said NFET region, to create a P type, pocket ion implanted region;

ion implanting an eight conductivity imparting dopant into said peripheral channel region, in said NFET region, to create an N type, ultra lightly doped source and drain region;

ion implanting a ninth conductivity imparting dopant into said peripheral channel region, in said NFET region, to create an N type, ultra shallow junction extension;

ion implanting a tenth conductivity imparting dopant into said peripheral channel region, in said PFET region, to create an N type, pocket ion implanted region;

ion implanting an eleventh conductivity imparting dopant into said peripheral channel region, in said PFET region, to create a P type, ultra lightly doped source and drain region;

ion implanting a twelfth conductivity imparting dopant into said peripheral channel region, in said PFET region, to create a P type, ultra shallow junction extension;

third rapid thermal annealing to activate dopants in said ultra shallow junction extension regions;

depositing an interlevel insulator layer thereon after third annealing;

opening contact holes in said interlevel insulator layer to said titanium silicide on said N type, heavily doped source and drain regions, to said titanium silicide on said P type, heavily doped source and drain regions, and to titanium silicide on said narrow polysilicon gate structures;

depositing an interconnect metallization layer thereon after forming said contact holes; and patterning of said interconnect metallization layer to form metal contacts to said N type, heavily doped source and drain regions, to said P type, heavily doped source and drain regions, and to said narrow polysilicon gate structures.

19. The method of claim 18, wherein said first conductivity imparting dopant, used to create said N well region, in said PFET region, is phosphorous, ion implanted at an energy between about 300 to 800 KeV, at a dose between about 5E12 to 1E13 atoms/cm$^2$.

20. The method of claim 18, wherein said gate insulator layer is silicon dioxide, grown in an oxygen—steam ambient, at a temperature between about 800° to 1000° C., to a thickness between about 30 to 300 Angstroms.

21. The method of claim 18, wherein said polysilicon layer is deposited using LPCVD processing, at a temperature between about 500° to 650° C., to a thickness between about 2000 to 4000 Angstroms.

22. The method of claim 18, wherein said narrow polysilicon gate structure is formed via anisotropic RIE of said polysilicon layer, using $Cl_2$ or $SF_6$ as an etchant, to create said narrow polysilicon gate structure with a width between about 1000 to 3500 Angstroms.

23. The method of claim 18, wherein said first silicon oxide layer, used as part of said dual sidewall insulator layer, is deposited using PECVD procedures, at a temperature between about 300° to 450° C., to a thickness between about 100 to 400 Angstroms.

24. The method of claim 18, wherein said titanium nitride layer, used as part of said dual sidewall layer, is deposited using chemical vapor deposition procedures, at a temperature between about 540° to 660° C., to a thickness between about 1000 to 3000 Angstroms.

25. The method of claim 18, wherein said titanium layer is deposited using r.f.sputtering procedures, to a thickness between about 300 to 450 Angstroms.

26. The method of claim 18, wherein said second rapid thermal annealing, used to form titanium silicide, is performed at a temperature between about 650° to 750° C., for a time between about 10 to 30 sec., in an nitrogen ambient.

27. The method of claim 18, wherein said unreacted titanium is removed using a 1:1:1 solution of $NH_4OH$—$H_2O_2$—$H_2O$, at a temperature between about 23° to 27° C.

28. The method of claim 18, wherein said titanium nitride layer is removed a 1:1:1 solution of $NH_4OH$—$H_2O_2$—$H_2O$, at a temperature between about 23° to 27° C., exposing said peripheral channel region.

29. The method of claim 18, wherein said seventh conductivity imparting dopant, ion implanted into said peripheral channel region, in said NFET region, to create said P type, pocket ion implanted region, is boron, ion implanted at an energy between about 20 to 80 KeV, at a dose between about 5E13 to 1E14 atoms/cm$^2$.

30. The method of claim 18, wherein said eight conductivity imparting dopant, ion implanted into said peripheral channel region, in said NFET region, to create said N type, ultra lightly doped source and drain regions, is phosphorous, ion implanted at an energy between about 20 to 30 KeV, at a dose between about 3E11 to 2E12 atoms/cm$^2$.

31. The method of claim 18, wherein said ninth conductivity imparting dopant, ion implanted into said peripheral region, in said NFET region, to create said N type, ultra shallow junction extension, is arsenic, ion implanted at an energy between about 10 to 25 KeV, at a dose between about 5E14 to 3E15 atoms/cm$^2$.

32. The method of claim 18, wherein said tenth conductivity imparting dopant, ion implanted into said peripheral channel region, in said PFET region, to create said N type, pocket ion implanted region, is phosphorous, ion implanted at an energy between about 100 to 160 KeV, at a dose between about 5E13 to 1E14 atoms/cm$^2$.

33. The method of claim 18, wherein said eleventh conductivity imparting dopant, ion implanted into said peripheral channel region, in said PFET region, to create said P type, ultra lightly doped source and drain regions, is BF$_2$, ion implanted at an energy between about 20 to 50 KeV, at a dose between about 5E11 to 2E12 atoms/cm$^2$.

34. The method of claim 18, wherein said twelfth conductivity imparting dopant, ion implanted into said peripheral channel region, in said PFET region, to create said P type, ultra shallow junction extension, is BF$_2$, ion implanted at an energy between about 10 to 20 KeV, at a dose between about 5E14 to 3E15 atoms/cm$^2$.

* * * * *